United States Patent
Kasahara et al.

(10) Patent No.: US 9,972,560 B2
(45) Date of Patent: May 15, 2018

(54) LEAD FRAME AND SEMICONDUCTOR DEVICE

(71) Applicant: SHINKO ELECTRIC INDUSTRIES CO., LTD., Nagano (JP)

(72) Inventors: Tetsuichiro Kasahara, Nagano (JP); Hideki Matsuzawa, Nagano (JP); Masayuki Okushi, Nagano (JP); Naoya Sakai, Kaohsiung (TW)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days. days.

(21) Appl. No.: 15/399,791

(22) Filed: Jan. 6, 2017

(65) Prior Publication Data
US 2017/0207148 A1  Jul. 20, 2017

(30) Foreign Application Priority Data

Jan. 18, 2016  (JP) .................................. 2016-007413

(51) Int. Cl.
| | |
|---|---|
| *H01L 23/495* | (2006.01) |
| *H01L 23/29* | (2006.01) |
| *H01L 23/31* | (2006.01) |
| *H01L 23/498* | (2006.01) |
| *H01L 21/48* | (2006.01) |

(52) U.S. Cl.
CPC .... *H01L 23/49537* (2013.01); *H01L 21/4821* (2013.01); *H01L 23/293* (2013.01); *H01L 23/3142* (2013.01); *H01L 23/49548* (2013.01); *H01L 23/49589* (2013.01); *H01L 23/49861* (2013.01); *H01L 2224/48091* (2013.01); *H01L 2924/181* (2013.01)

(58) Field of Classification Search
CPC ......... H01L 23/49589; H01L 23/49537; H01L 23/49548; H01L 23/3142; H01L 23/293; H01L 2224/48091; H01L 2924/181
See application file for complete search history.

(56) References Cited

U.S. PATENT DOCUMENTS

| | | | | |
|---|---|---|---|---|
| 6,197,615 B1* | 3/2001 | Song | ................. | H01L 23/49503 |
| | | | | 257/E23.037 |
| 6,316,825 B1* | 11/2001 | Park | ................. | H01L 23/49537 |
| | | | | 257/666 |
| 2004/0014257 A1* | 1/2004 | Kim | .................... | H01L 23/4951 |
| | | | | 438/111 |

(Continued)

FOREIGN PATENT DOCUMENTS

JP  2000-307049  11/2000

*Primary Examiner* — Ahmed Sefer
(74) *Attorney, Agent, or Firm* — IPUSA, PLLC

(57) ABSTRACT

A lead frame includes a first lead frame including a first lead; a second lead frame including a second lead, the second lead frame being stacked on the first lead frame so that a space is formed between the first lead frame and the second lead frame, and the second lead being bonded to the first lead; and a resin portion provided in the space formed between the first lead frame and the second lead frame, wherein each of the first lead and the second lead includes an embedded portion embedded in the resin portion, and a protruding portion protruded from the resin portion, and wherein the embedded portion of the first lead and the embedded portion of the second lead are bonded in the resin portion.

13 Claims, 16 Drawing Sheets

(56) References Cited

U.S. PATENT DOCUMENTS

| | | | |
|---|---|---|---|
| 2004/0253769 A1* | 12/2004 | Mita | H01L 21/486 438/126 |
| 2007/0273017 A1* | 11/2007 | Maloney | H01L 23/3107 257/690 |
| 2008/0157309 A1* | 7/2008 | Hojo | H01L 21/561 257/676 |
| 2009/0014854 A1* | 1/2009 | Cho | H01L 23/49537 257/676 |
| 2014/0118956 A1* | 5/2014 | Kim | H01L 23/049 361/728 |

* cited by examiner

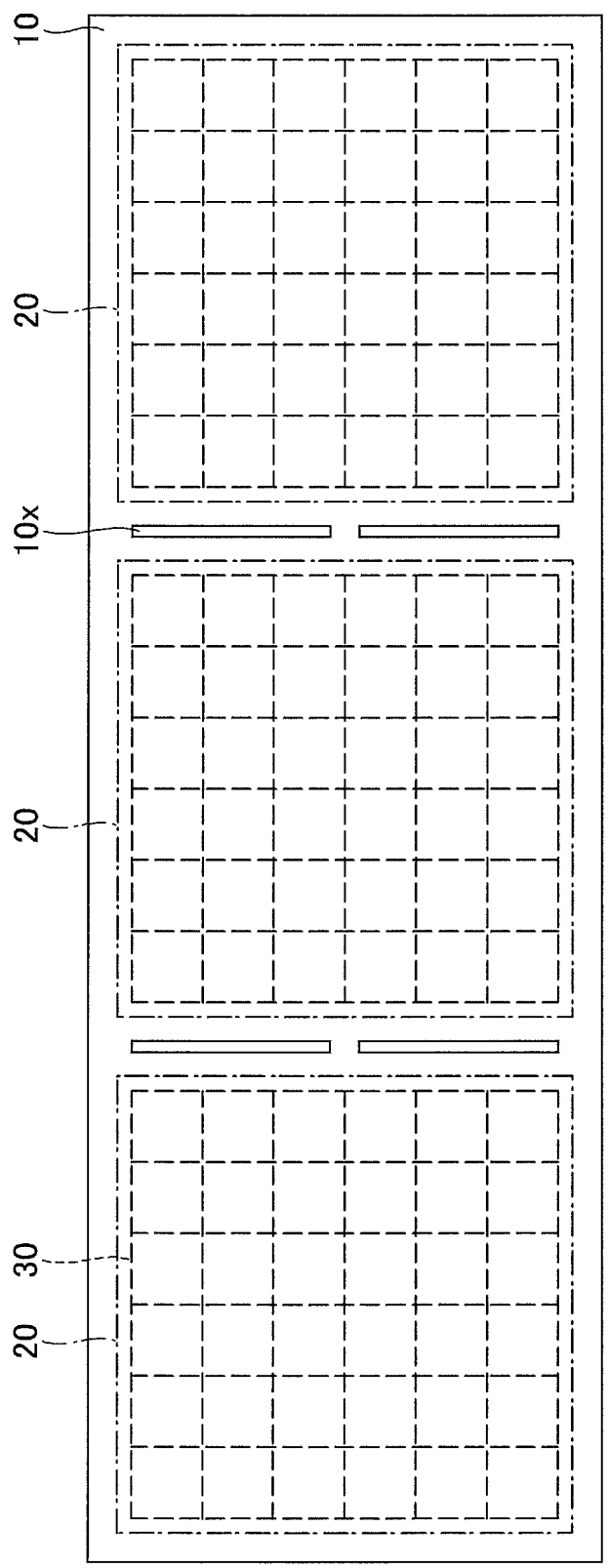

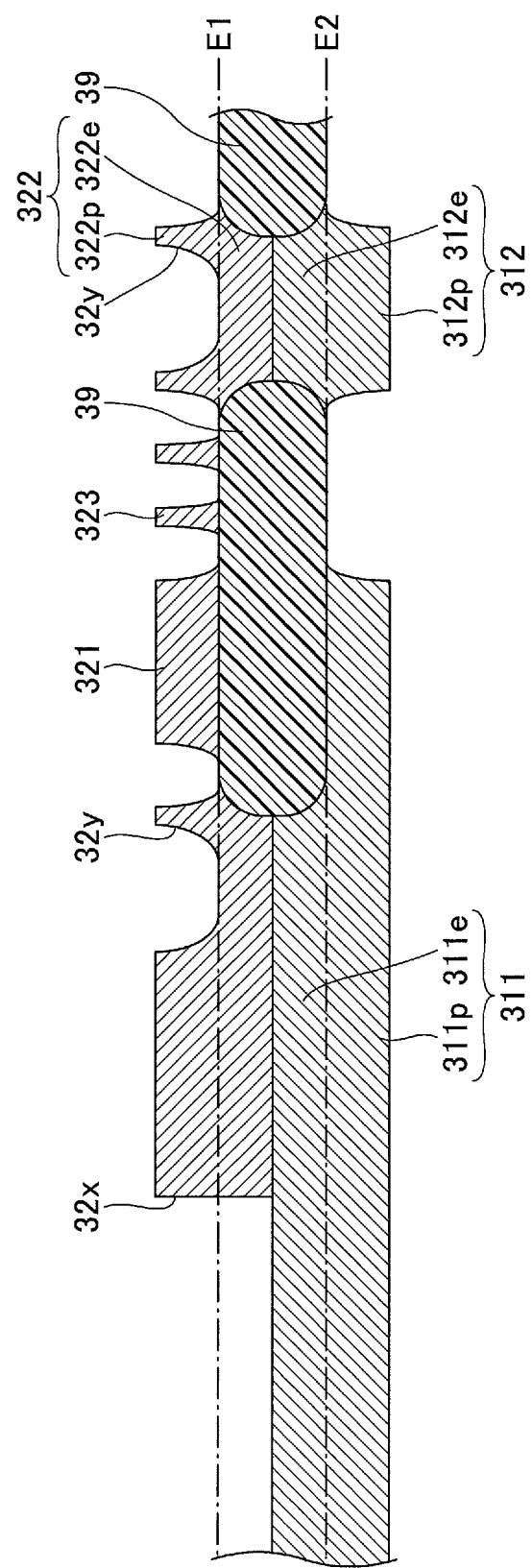

LEAD FRAME AND SEMICONDUCTOR DEVICE

CROSS-REFERENCE TO RELATED APPLICATIONS

The present application is based on and claims the benefit of priority of Japanese Priority Application No. 2016-007413 filed on Jan. 18, 2016, the entire contents of which are hereby incorporated by reference.

FIELD

The present invention relates to a lead frame and a semiconductor device.

BACKGROUND

Conventionally, a leadless semiconductor device such as a QFN (Quad Flat No Lead) is known as a semiconductor device that includes a lead frame, for example. In such a semiconductor device, recently, it is required to increase the number of terminals, and in response to this, the terminals are provided in a plurality of columns or the like.

However, in order to provide the terminals in a plurality of columns, it is necessary to provide wirings with a narrow pitch. The wirings of the lead frame are formed by penetrating a metal plate from upper and lower surfaces by etching. As the etching proceeds, not only in a depth direction, in a width direction as well, if the metal plate is thick, the space between the wirings becomes broad, and the wirings cannot be provided with a narrow pitch. Thus, conventionally, a metal plate with a thickness of about 0.2 mm is used. However, in order to provide the wirings with a narrower pitch, it has been studied to use a thinner metal plate.

However, if the wirings are formed by etching a thin metal plate, a risk that the wirings are deformed increases. Thus, it is difficult to actualize a lead frame that uses a metal plate thinner than a certain level.

Patent Document 1: Japanese Laid-open Patent Publication No. 2000-307049

SUMMARY

The present invention is made in light of the above problems, and provides a lead frame that is hardly deformed even when being made thinner.

According to an embodiment, there is provided a lead frame including: a first lead frame including a first lead; a second lead frame including a second lead, the second lead being bonded to the first lead; and a resin portion provided between the first lead frame and the second lead frame, wherein each of the first lead and the second lead includes an embedded portion embedded in the resin portion, and a protruding portion protruded from the resin portion, and wherein the embedded portion of the first lead and the embedded portion of the second lead are bonded in the resin portion.

BRIEF DESCRIPTION OF DRAWINGS

Other objects, features and advantages of the present invention will become more apparent from the following detailed description when read in conjunction with the accompanying drawings.

FIG. 1 is a plan view illustrating an example of a lead frame of a first embodiment;

FIG. 18 is an enlarged view illustrating the part of FIG. 2C surrounded by a broken line.

DESCRIPTION OF EMBODIMENTS

Figure 2A:
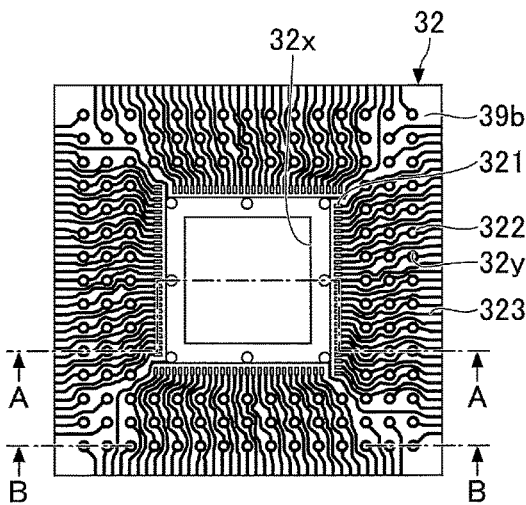
FIG. 2A to FIG. 2D are views illustrating an example of a unit lead frame that constitutes the lead frame of the first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

First Embodiment (Structure of Lead Frame)

FIG. 1 is a plan view illustrating a lead frame 1 of a first embodiment. With reference to FIG. 1, the lead frame 1 includes a substrate frame 10, having a substantially rectangular shape in a planar view, in which a plurality of unit lead frame groups 20 are aligned with a space therebetween. The unit lead frame group 20 is a group of a plurality of unit lead frames 30 that are aligned in a matrix.

In an example of FIG. 1, three of the unit lead frame groups 20 are aligned in a line. However, the number of the unit lead frame groups 20 that are aligned may be arbitrarily determined. Further, the unit lead frame groups 20 may be aligned in a plurality of columns. Further, although slits 10x are provided between each adjacent unit lead frame groups 20 in FIG. 1, the slits 10x are not necessarily provided.

For the material of the lead frame 1, copper (Cu), Cu-based alloy, iron-nickel (Fe—Ni), Fe—Ni-based alloy or the like may be used, for example. The thickness of the lead frame 1 may be about 0.2 mm, for example.

The unit lead frame 30 is a semiconductor chip mounting area on which a semiconductor chip is mounted. Further, the unit lead frame 30 is diced as an individual semiconductor device, at last. For the example illustrated in FIG. 1, each of the unit lead frame groups 20 is constituted by the unit lead frames 30 that are aligned in six lines and six columns. However, the number of the unit lead frames 30 that constitute each of the unit lead frame groups 20 may be arbitrarily determined.

Figure 2B:
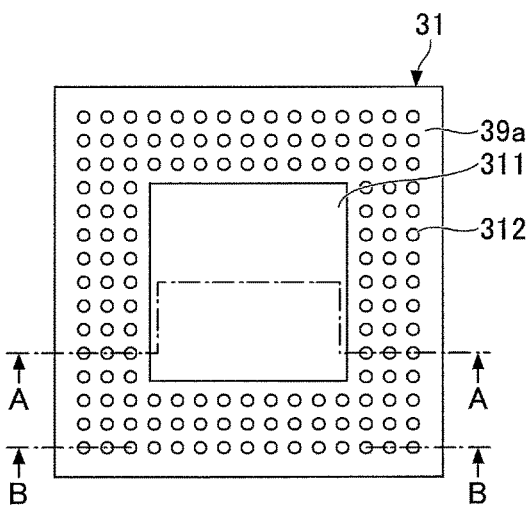
Figure 2C:
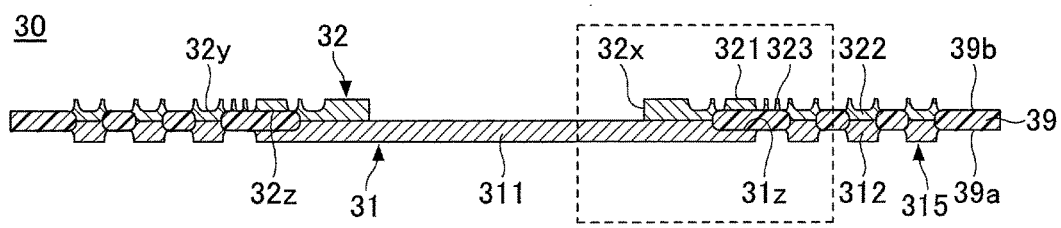
Figure 2D:
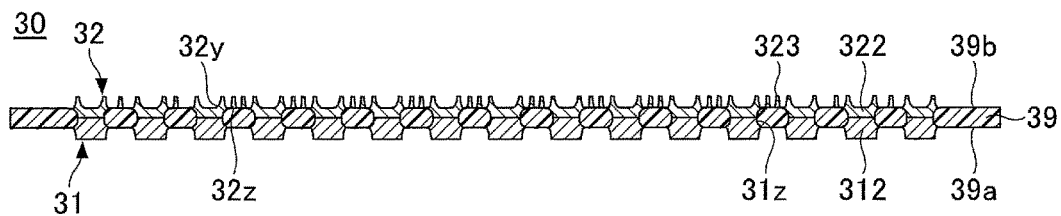

FIG. 2A to FIG. 2D are views illustrating an example of the unit lead frame 30 that constitutes the lead frame 10 of the first embodiment. FIG. 2A is a plan view, FIG. 2B is a bottom view, FIG. 2C is a cross-sectional view taken along an A-A line of FIG. 2A and FIG. 22, and FIG. 2D is a cross-sectional view taken along a B-B line of FIG. 2A and FIG. 2B. FIG. 18 is an enlarged view illustrating the part of FIG. 2C surrounded by a broken line.

With reference to FIG. 2A to FIG. 2D, the unit lead frame 30 includes a frame 31, a frame 32 and a resin portion 39. In this embodiment, the frame 31 is a typical example of a first lead frame of the invention. The frame 32 is a typical example of a second lead frame of the invention.

In this embodiment, a frame 32 side of the unit lead frame 30 is referred to as an upper side or one side, and a frame 31 side of the unit lead frame 30 is referred to as a lower side or the other side. Further, a surface of each component at the frame 32 side is referred to as one surface or an upper surface, and a surface of each component at the frame 31 side is referred to as the other surface or a lower surface. However, the unit lead frame 30 may be used in an opposite direction or may be used at an arbitrary angle. Further, in this embodiment, "in a planar view" means that an object is seen in a direction that is normal to one surface of the frame 32, and a "planar shape" means a shape of an object seen in the direction that is normal to the one surface of the frame 32.

The unit lead frame 30 has a structure in which a lower surface of the frame 32 is overlapped on an upper surface of the frame 31 and bonded with each other by welding. The resin portion 39 is filled in spaces formed between the upper surface of the frame 31 and the lower surface of the frame 32. The resin portion 39 is formed to extend in a horizontal direction from the spaces formed by the upper surface of the frame 31 and the lower surface of the frame 32 toward areas that do not overlap the frame 31 and the frame 32 in a planar view and form outer edges of a rectangular shape. The thickness (the thickness at the thickest portion) of the unit lead frame 30 may be about 0.2 mm, for example. Hereinafter, each component of the unit lead frame 30 is described in detail.

The frame 31 includes a chip mounting portion 311 (die pad) and a plurality of leads 312. The thickness (the thickness at the thickest portion) of the frame 31 may be about 0.1 mm, for example. The lead 312 is a typical example of a first lead.

A semiconductor chip is mounted the chip mounting portion 311. The chip mounting portion 311 may be provided at a substantially middle portion of the frame 31, for example. The chip mounting portion 311 includes an embedded portion 311e (see FIG. 18) that is embedded in the resin portion 39, and a protruding portion 311p (see FIG. 18) that protrudes from a lower surface 39a of the resin portion 39. The thickness of the chip mounting portion 311 may be about 0.1 mm, for example. The chip mounting portion 311 is electrically insulated from each of the leads 312.

Here, "a portion that is embedded in the resin portion 39" means the portion that exists within a range where the resin portion 39 is provided in the thickness direction. This is the same for other components as well.

The leads 312 may be provided in a plurality of columns to surround the chip mounting portion 311, for example. The lead 312 includes an embedded portion 312e (see FIG. 18) that is embedded in the resin portion 39, and a protruding portion 312p (see FIG. 18) that protrudes from the lower surface 39a of the resin portion 39. The thickness of the lead 312 is about 0.1 mm, for example. The planar shape of the lead 312 may be a circular shape whose diameter is about 0.2 mm, for example.

The frame 32 includes a plurality of bonding pads 321, a plurality of leads 322 and a plurality of wirings 323. The frame 32 is provided with, at a substantially middle portion, an open portion 32x that exposes an upper surface of the chip mounting portion 311 of the frame 31. The thickness (the thickness at the thickest portion) of the frame 32 may be about 0.1 mm, for example. The lead 322 is a typical example of a second lead of the invention.

The bonding pad 321 is a portion that is connected to an electrode of a semiconductor chip mounted on the chip mounting portion 311 of the frame 31 via a metal wiring. The bonding pads 321 may be provided to surround the open portion 32x (the chip mounting portion 311 of the frame 31), for example. The bonding pads 321 may be provided in a plurality of columns. The bonding pads 321 are provided at an upper surface 39b of the resin portion 39, and do not include a portion that is embedded in the resin portion 39. The thickness of the bonding pad 321 may be about a half of the thickness (the thickness at the thickest portion) of the frame 32, and may be about 0.05 mm, for example.

The leads 322 are provided to overlap the leads 312 of the frame 31, respectively, in a planar view. The lead 322 includes an embedded portion 322e (see FIG. 18) that is embedded in the resin portion 39 and a protruding portion 322p (see FIG. 18) that protrudes from the upper surface 39b of the resin portion 39. The embedded portion 322e of the lead 322 and the embedded portion 321e of the respective lead 321 are bonded in the resin portion 39 by welding, and form an external connection terminal 315. The thickness of the lead 322 may be about 0.1 mm, for example. The planar shape of the lead 322 may be a circular shape whose diameter is about 0.2 mm, for example.

A concave portion 32y is formed at an upper surface of the lead 322. More specifically, the concave portion 32y is provided at the protruding portion 322p that is formed right above the embedded portion 322e of the lead 322. The concave portion 32y is provided as a mark for welding, and further, by providing the concave portion 32y, the thickness of the frame 32 can be made partially thinner so that the welding efficiency can be improved. In this embodiment, as the lead 312 and the lead 322 are bonded mainly by welding, the concave portion 32y is provided at the upper surface of the lead 322. However, a portion other than the leads 312 and the leads 322 may be bonded by welding. For example, in this embodiment, the concave portions 32y are also provided at a plurality of portions of the frame 32 at inside of the bonding pads 321 (eight portions in the example illustrated in FIG. 2A to FIG. 2D). Then, the frame 31 and the frame 32 are bonded by welding at those portions. The frame 31 and the frame 32 may be welded at portions other than those exemplified here that are arbitrarily selected, by considering the necessary bonding strength or the like. In such a case, the concave portions 32y may be provided at such selected portions.

Concave portions 32z are formed at a lower surface of the frame 32. The depth of the concave portion 32z is about a half of the thickness (the thickness at the thickest portion) of the frame 32, and may be about 0.05 mm, for example. Further, concave portions 31z are formed at an upper surface of the frame 31. The depth of the concave portion 31z is about a half of the thickness (the thickness at the thickest portion) of the frame 31, and may be about 0.05 mm, for example. The resin portion 39 is filled in spaces formed by the concave portions 32z of the frame 32 and the concave portions 31z of the frame 31, and extends outside of the spaces. For the material of the resin portion 39, thermosetting epoxy based resin or the like may be used, for example. The thickness of the resin portion 39 may be about 0.1 mm, for example.

A constriction is formed at a side surface of the embedded portion 322e of the lead 322 by the respective concave portion 32z, while a constriction is formed at a side surface of the embedded portion 312e of the lead 312 by the respective concave portion 31z. The resin portion 39 is filled in the constriction at the side surface of the embedded portion 322e of the lead 322 and the constriction at the side surface of the embedded portion 312e of the lead 312. With this, an anchor is formed for each of the external connection terminals 315, and the external connection terminals 315 are prevented from being pulled out from the resin portion 39. Similarly, an anchor is formed at the side surface of the chip mounting portion 311 and the chip mounting portion 311 is prevented from being pulled out from the resin portion 39.

It is preferable that a surface roughing process or an oxidation process is performed at portions of the leads 312 and the leads 322 that contact surfaces of the resin portion 39 in order to improve adherence of the leads 312 and 322 with the resin portion 39.

The wirings 323 may be provided at an arbitrarily selected area on the upper surface 39b of the resin portion 39 at which the bonding pads 321 and the leads 322 are not provided. The wiring 323 does not include a portion that is embedded in the resin portion 39. The wirings 323 may be appropriately electrically connected to the bonding pads 321 and the leads 322, respectively. The thickness of the wiring 323 may be about a half of the thickness (the thickness at the thickest portion) of the frame 32, and may be about 0.05 mm, for example. The line/space of the wirings 323 may be about 30 µm/60 µm, for example.

Here, the line of line/space expresses a wiring width, and the space of line/space expresses a space between the adjacent wirings (wiring space). For example, when it is described as line/space=30 µm/60 µm, this means that the wiring width is 30 µm and the space between the adjacent wirings is 60 µm.

(Method of Manufacturing Lead Frame)

Figure 3A:
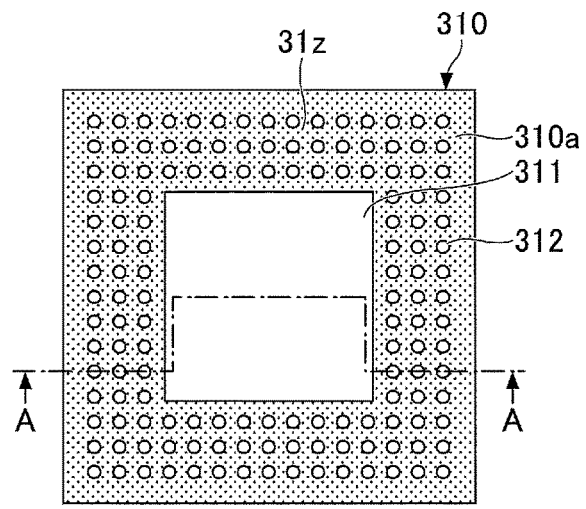
FIG. 3A to FIG. 3C are views (No. 1) illustrating an example of manufacturing steps of the lead frame of the first embodiment.
Figure 3B:
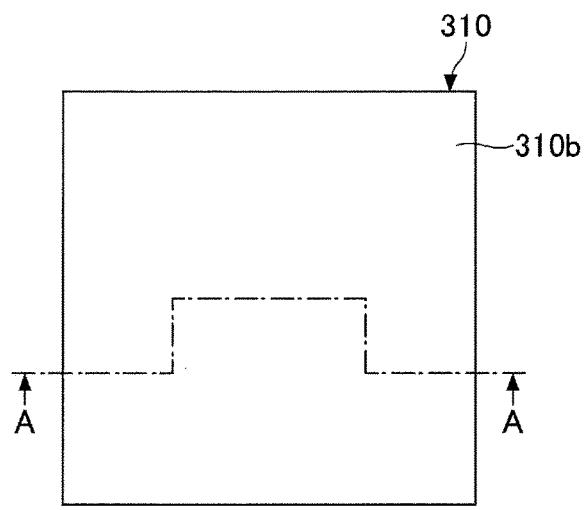
Figure 3C:
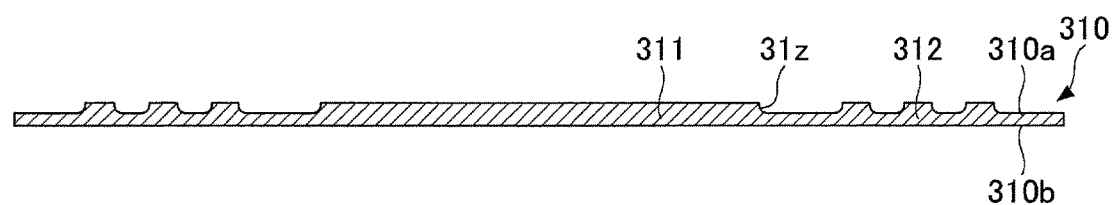
Figure 4A:
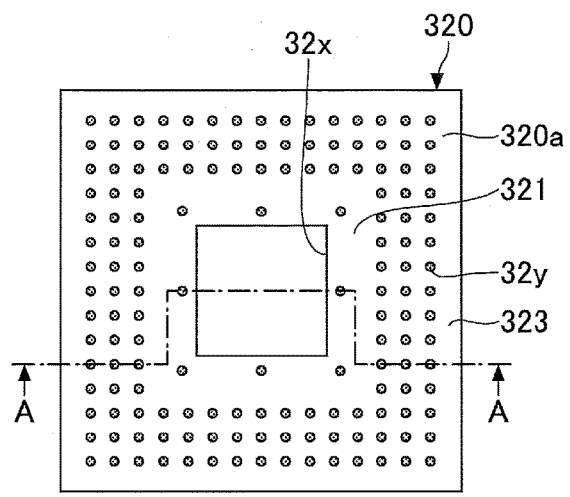
FIG. 4A to FIG. 4C are views (No. 2) illustrating an example of the manufacturing steps of the lead frame of the first embodiment.
Figure 4B:
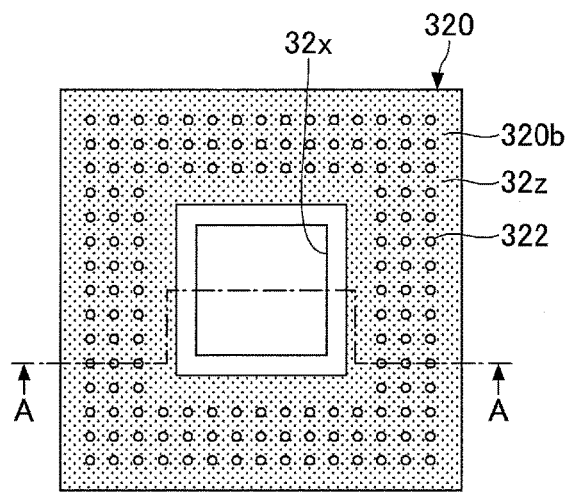
Figure 4C:
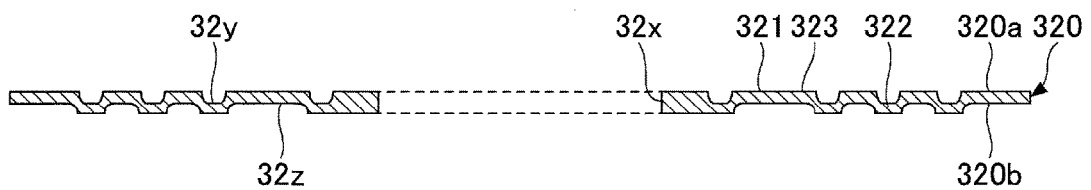

Next, a method of manufacturing the lead frame 1 of the first embodiment is described while illustrating the unit lead frame 30. FIG. 3A to FIG. 5D are views illustrating an example of manufacturing steps of the lead frame 1 of the first embodiment. FIG. 3A and FIG. 4A are plan views, FIG. 3B and FIG. 4B are bottom views, and FIG. 3C and FIG. 4C are cross-sectional views taken along an A-A line in FIG. 3A and FIG. 4A, respectively. FIG. 5A to FIG. 5D are cross-sectional views corresponding to FIG. 3C and FIG. 4C.

First, in a step illustrated in FIG. 3A to FIG. 3C, a metal plate 310 is prepared. Then, an upper surface 310a of the metal plate 310 is half etched to form the concave portions 31z. A corner portion between a side surface and a bottom surface in each of the concave portions 31z formed by half etching has an R shape, is round and is not sharp, in a cross-sectional view. Here, a lower surface 310b of the metal plate 310 is a flat surface because it is not etched.

Parts of the upper surface 310a of the metal plate 310, at which the concave portions 31z are not formed, become the chip mounting portion 311 and the plurality of leads 312. Although numerals are provided to portions that become the chip mounting portion 311 and the leads 312 in FIG. 3A to FIG. 3C for explanatory purposes, the portions that become the chip mounting portion 311 and the leads 312 are still integrally formed and are not separated from each other, at this stage.

For the material of the metal plate 310, copper (Cu), Cu-based alloy, iron-nickel (Fe—Ni), Fe—Ni-based alloy or the like may be used, for example. The thickness of the metal plate 310 may be about 0.1 mm, for example. The depth of the concave portion 31z may be about 0.05 mm, for example. In FIG. 3A, areas at which the concave portions 31z are formed (areas that are half etched) are illustrated by grey patterns for explanatory purposes. This means that portions without the grey patterns in FIG. 3A are protruded.

Next, in a step illustrated in FIG. 4A to FIG. 4C, a metal plate 320 is prepared. Then, an upper surface 320a of the metal plate 320 is half etched to form the concave portions 32y. Further, a lower surface 320b of the metal plate 320 is half etched to form the concave portions 32z. Further, the open portion 32x that penetrates the metal plate 320 is formed by half etching each of the upper surface 320a and the lower surface 320b of the metal plate 320 at a position that overlaps in a planar view. A corner portion between a side surface and a bottom surface in each of the concave portions 32y and 32z formed by half etching has an R shape, is round and is not sharp, in a cross-sectional view.

Parts of an area at which the concave portions 32y are not formed become the bonding pads 321 and the wirings 323, respectively. Further, parts of an area at which the concave portions 32y are formed become the leads 322, respectively. Although numerals are provided to portions that become the bonding pads 321, the leads 322 and the wirings 323 in FIG. 4A to FIG. 4C for explanatory purposes, the portions that become the bonding pads 321, the leads 322 and the wirings 323 are still integrally formed and are not separated from each other, at this stage.

The material of the metal plate 320 may be the same as that of the metal plate 310, for example. The thickness of the metal plate 320 may be about 0.1 mm, for example. The depth of each of the concave portions 32y and 32z may be about 0.05 mm, for example. In FIG. 4A and FIG. 4B, areas at which the concave portions 32y and 32z are formed (areas that are half etched) are illustrated by grey patterns for explanatory purposes, respectively. This means that portions without the grey patterns in FIG. 4A and FIG. 4B are protruded.

Figure 5A:
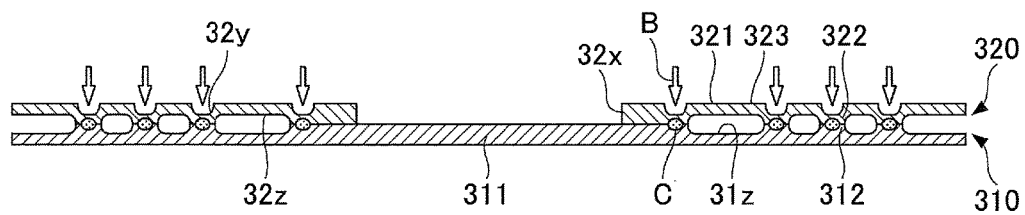
FIG. 5A to FIG. 5D are views (No. 3) illustrating an example of the manufacturing steps of the lead frame of the first embodiment.

Next, in a step illustrated in FIG. 5A, the metal plate 320 is placed on the metal plate 310 such that portions that become the leads 312 and portions that become the leads 322 overlap with each other, respectively, in a planar view (such that the concave portions 31z and the respective concave portions 32z face with each other to form spaces, respectively). Hereinafter, the portions that become the leads 312 are referred to as "portions to be the leads 312", and the portions that become the leads 322 are referred to as "portions to be the leads 322". Then, laser beam is irradiated from a direction of arrows B at the concave portions 32y, which function as a mark, to locally melt metal materials of the portions to be the leads 312 and the portions to be the leads 322, and bond the metal plate 310 and the metal plate 320 (laser welding). As the laser beam, green laser that uses second harmonic generation (SHG) or the like may be used, for example. In such a case, wavelength of the laser beam may be about 532 nm, for example. In FIG. 5A, grey patterns C are schematically illustrating portions at which the metal materials are locally melted (not illustrated in other drawings).

Figure 5B:
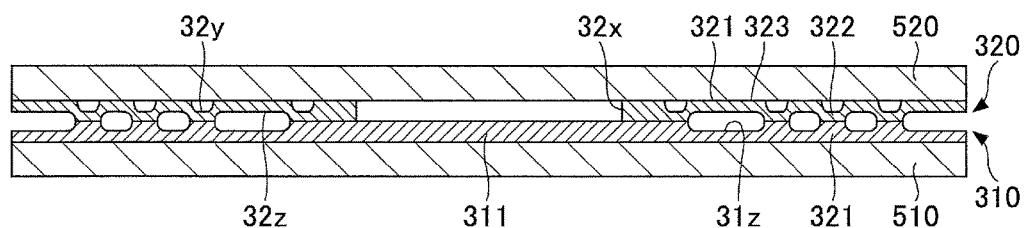

Next, in a step illustrated in FIG. 5B, the structure illustrated in FIG. 5A is sandwiched by a lower die 510 and an upper die 520. Then, in a step illustrated in FIG. 5C, resin is filled in space portions formed by the metal plate 310 and the metal plate 320, and is cured to form the resin portion 39. The resin portion 39 may be formed by transfer molding, compression molding, injection molding or the like, for example. For the material of the resin portion 39, thermosetting epoxy based resin or the like may be used, for example.

Figure 5C:
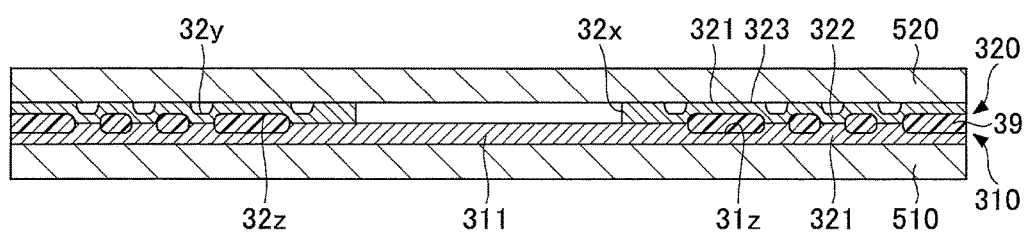
Figure 5D:
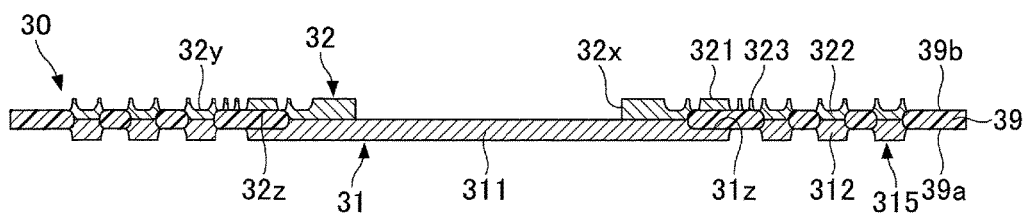

Next, in a step illustrated in FIG. 5D, after releasing the structure illustrated in FIG. 5C from the lower die 510 and the upper die 520, predetermined portions of the metal plates 310 and 320 are removed by etching. With this, the chip mounting portion 311 and the portions to be the leads 312 of the metal plate 310 are separated from each other, and the frame 31 is formed at a lower surface 39a side of the resin portion 39. Further, portions to be the bonding pads 321, the leads 322 and the wirings 323 of the metal plate 320 are separated from each other, and the frame 32 is formed at an upper surface 39b side of the resin portion 39. Further, at this time, parts of the resin portion 39 are exposed at an upper surface side of the frame 32 and at a lower surface side of the frame 31. With the above described steps, the lead frame 1 including the unit lead frames 30 is completed (see FIG. 1 and FIG. 2A to FIG. 2D).

Here, it is preferable to perform a surface roughing process or a blacking process (oxidation process) on surfaces of the metal plates 310 and 320 between the steps illustrated in FIG. 5A and FIG. 5B in order to improve adherence between the metal plates 310 and 320 and the resin portion 39. The surface roughing process is to form concave-convex at the surfaces of the metal plates 310 and 320 to improve adherence between the metal plates 310 and 320 and the resin portion 39 by an anchor effect. Further, the blacking process (oxidation process) is to chemically form oxide films at the surfaces of the metal plates 310 and 320 to suppress formation of unstable oxide films at the surfaces of the metal plates 310 and 320 which may reduce adherence between the metal plates 310 and 320 and the resin portion 39.

As such, according to the lead frame 1 of the first embodiment, concave portions are formed in each of the metal plate 310 and the metal plate 320 by first etching, and the metal plate 310 and the metal plate 320 are bonded by welding such that to form spaces by the concave portions. Then, after forming the resin portion 39 in the space portions formed by the metal plate 310 and the metal plate 320, predetermined portions of the metal plates 310 and 320 are removed by second etching to form the bonding pads 321, the wirings 323 and the like.

When removing the predetermined portions of the metal plates 310 and 320 by the second etching, the thickness of the portions to be the bonding pads 321 and the wirings 323 is about a half due to the first etching (half etching) of the metal plate 320. Thus, it is possible to form the bonding pads 321 and the wirings 323 with narrower pitch (smaller line/space) by the second etching. As a result, the number of the bonding pads 321 and the number of the external connection terminals 315 connected to the bonding pads 321, respectively, can be increased.

Although the line/space of wirings of a conventional lead frame is about 100 μm/100 μm, for the wirings 323, the line/space about 30 μm/60 μm can be actualized.

Further, as the bonding pads 321 and the wirings 323 are formed on the resin portion 39, a risk that the bonding pads 321 and the wirings 323 are deformed when their pitches are made narrower and the number of each of the bonding pads 321 and the wirings 323 is increased can be lowered.

(Example of Semiconductor Device)

Figure 6:
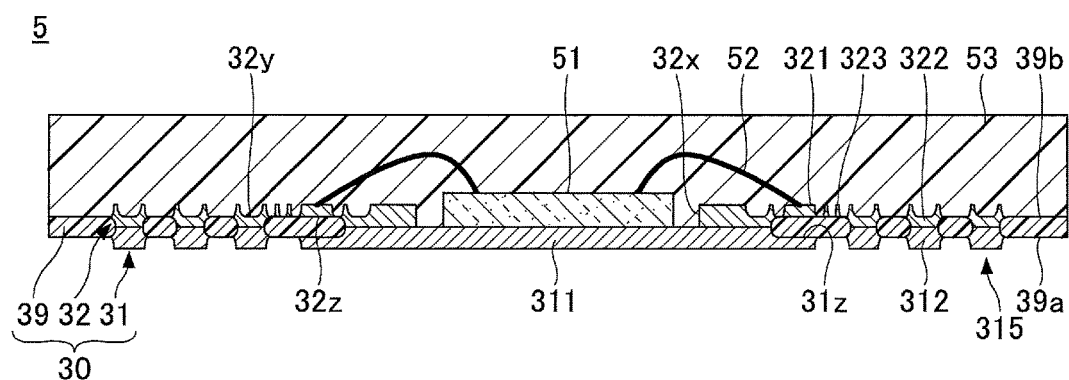
FIG. 6 is a cross-sectional view illustrating an example of a semiconductor device including the lead frame of the first embodiment.

FIG. 6 is a cross-sectional view illustrating an example of a semiconductor device 5 including the lead frame (unit lead frame 30) of the first embodiment.

With reference to FIG. 6, the semiconductor device 5 includes the unit lead frame 30, a semiconductor chip 51, metal wirings 52 and a sealing resin 53. The semiconductor device 5 is a QFN type semiconductor device.

The semiconductor chip 51 is mounted on the upper surface of the chip mounting portion 311 of the unit lead frame 30 in a face-up manner via an adhesion layer or the like (not illustrated in the drawings) such as a die attach film or the like. Electrodes (not illustrated in the drawings) of the semiconductor chip 51 are electrically connected to the bonding pads 321 of the unit lead frame 30 via the metal wirings 52 (bonding wires) such as a gold wirings, copper wirings or the like, respectively.

The sealing resin 53 is provided to cover an upper surface side of the unit lead frame 30, the semiconductor chip 51 and the metal wirings 52. For the material of the sealing resin 53, epoxy based resin or the like that has good rigidity may be used. The sealing resin 53 may contain fillers such as silica ($SiO_2$).

In order to manufacture the semiconductor device 5, first, the semiconductor chip 51 is mounted on the upper surface of the chip mounting portion 311 of each of the unit lead frames 30 of the lead frame 1 illustrated in FIG. 1 in a face-up manner via an adhesion layer or the like (not illustrated in the drawings) such as a die attach film.

Next, the electrodes formed at the upper surface of the semiconductor chip 51 are electrically connected to the bonding pads 321 of the unit lead frame 30 via the metal wirings 52, respectively, by wire bonding.

Next, the sealing resin 53 is formed to cover the upper surface side of the unit lead frame 30, the semiconductor chip 51 and the metal wirings 52. The sealing resin 53 may be formed by transfer molding, compression molding, injection molding or the like, for example. The sealing resin 53 may be formed for each of the unit lead frame groups 20 illustrated in FIG. 1, for example.

Thereafter, the unit lead frame group 20 for which the sealing resin 53 and the like are formed is individualized into the unit lead frames 30 by cutting by a dicer or the like to complete a plurality of the semiconductor devices 5 (see FIG. 6).

As such, by using the lead frame 1 including the unit lead frames 30, the semiconductor device 5 in which the number of the external connection terminals 315 is increased compared with a conventional product can be actualized.

Further, the lower end portion of the lead 312 that constitutes the external connection terminal 315 is protruded from the lower surface 39a of the resin portion 39. Thus, when mounting the semiconductor device 5 on a wiring board or the like, solder wetly spreads at a side surface of the protruding portion 312p (see FIG. 18) of the lead 312. Therefore, reliability in connection between the semiconductor device 5 and the wiring board or the like can be improved.

Alternative Example 1 of First Embodiment

In alternative example 1 of the first embodiment, an example of a lead frame in which a stacked structure of the leads is different from that of the first embodiment is described. It is to be noted that, in the alternative example 1 of the first embodiment, the same components already described in the above embodiment are given the same reference numerals, and explanations are not repeated.

Figure 7:
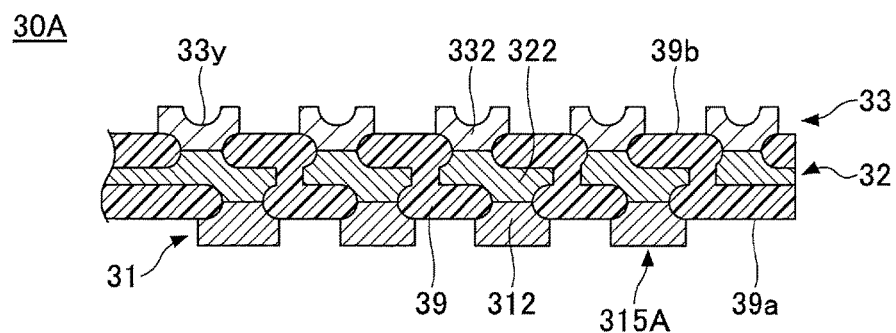
FIG. 7 is a cross-sectional view illustrating an alternative example 1 of the lead frame of the first embodiment.

FIG. 7 is a cross-sectional view illustrating an example of a lead frame of the alternative example 1 of the first embodiment, in which only the vicinity of leads of a unit lead frame 30A is illustrated in an enlarged manner. The unit lead frame 30A illustrated in FIG. 7 includes the frame 31, the frame 32, a frame 33 and the resin portion 39. In this embodiment, the frame 31 is a typical example of a first lead frame of the invention. Further, the frame 33 is a typical example of a second lead frame of the invention.

The unit lead frame 30A has a structure in which the lower surface of the frame 32 is overlapped on the upper surface of the frame 31 to be welded, and then, a lower surface of the frame 33 is overlapped on the upper surface of the frame 32 to be welded. The resin portion 39 is filled in spaces formed by the upper surface of the frame 31 and the lower surface of the frame 32, and spaces formed by the upper surface of the frame 32 and the lower surface of the frame 33. The resin portion 39 is formed to extend from the spaces formed by the upper surface of the frame 31 and the lower surface of the frame 32, and the spaces formed by the upper surface of the frame 32 and the lower surface of the frame 33 toward areas that do not overlap the frame 31, the frame 32 and the frame 33 in a planar view to form outer edges of a rectangular shape.

Similar to the first embodiment, the leads 312 and the leads 322 are formed in the frame 31 and the frame 32, respectively. The leads 312 and the leads 322 are provided to overlap with each other in a planar view and bonded by welding, respectively. Leads 332 are formed in the frame 33. The lead 332 is provided above the lead 322 such that its center is shifted (deviated) from the centers of the leads 312 and 322, respectively, in a planar view, and bonded to the lead 322 by welding. The frame 32 and the frame 33 are welded at positions at which the concave portions 33y, which functions as a mark, are formed, respectively.

The lead 312 is a typical example of a first lead of the invention. The lead 332 is a typical example of a second lead of the invention. The lead 322 is a typical example of a third lead of the invention.

Here, although not illustrated in the drawings, the bonding pads 321 and the wirings 323 are formed in the frame 33 in the unit lead frame 30A. Further, wirings that are similar to the wirings 323, respectively, may be formed in the frame 32.

As such, the external connection terminal 315A is formed by stacking the lead 312, the lead 322 and the lead 332 in this order in the unit lead frame 30A. The external connection terminal 315A formed by stacking the lead 312, the lead 322 and the lead 332 has a so-called staggered via structure in which leads adjacent to each other in an upper and lower direction of the structure are provided at different positions in a planar view.

Further, not only the frame 32, two or more frames may be provided between the frame 31 and the frame 33 (as the frames embedded in the resin portion 39). In such a case, the external connection terminal 315A in which four or more leads are stacked having a so-called staggered via can be actualized.

FIG. 8A to FIG. 8D are views illustrating an example of manufacturing steps of the lead frame of the alternative example 1 of the first embodiment. FIG. 8A to FIG. 8D are views for mainly explaining steps for manufacturing leads and illustrate cross-sections corresponding to FIG. 7.

First, after performing steps similar to those described above with reference to FIG. 3A to FIG. 4C, in a step illustrated in FIG. 5A, similar to the step illustrated in FIG. 5A, the metal plate 320 is placed on the metal plate 310 such that the portions to be the leads 312 and the portions to be the leads 322 overlap with each other, respectively, in a planar view. Then, the metal materials of the portions to be the leads 312 and the portions to be the leads 322 are locally melted by irradiating laser beam from a direction of arrows B at the concave portions 32y, which function as a mark, to bond the metal plate 310 and the metal plate 320 (laser welding).

Figure 8A:
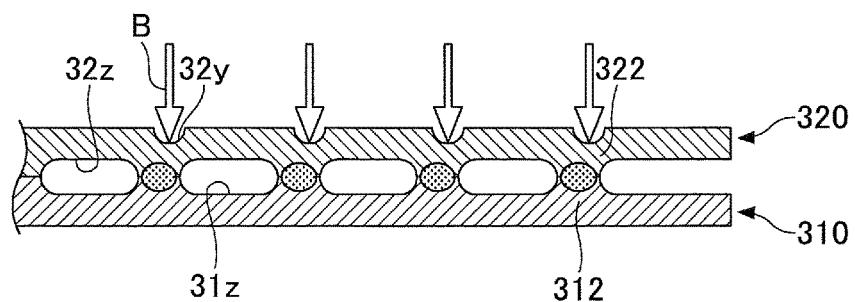
FIG. 8A to FIG. 8D are views illustrating an example of manufacturing steps of the alternative example 1 of the lead frame of the first embodiment.
Figure 8B:
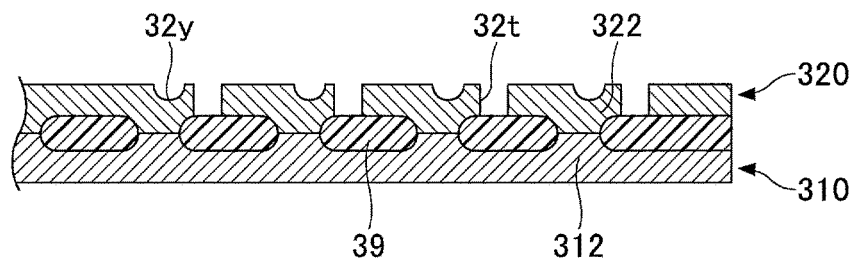

Next, in a step illustrated in FIG. 8B, similar to the step illustrated in FIG. 5B and FIG. 5C, resin is filled in space portions formed by the metal plate 310 and the metal plate 320, and the resin portion 39 is formed by curing it. Thereafter, open portions 32t that selectively expose the upper surface of the resin portion 39 are formed in the metal plate 320 by etching, laser processing or the like.

Next, in a step illustrated in FIG. 8C, similar to the step illustrated in FIG. 4A to FIG. 4C, a metal plate 330 provided with portions that become the leads 332 (hereinafter, referred to as "portions to be the leads 332"), concave portions 33y and concave portions 33z is formed. Further, concave portions 32z' are formed at the upper surface of the metal plate 320 by etching. At this time, the concave portions 32z' are formed to include the concave portions 33y, respectively. Then, the metal plate 330 is placed on the metal plate 320 such that the centers of the portions to be the leads 332, on the portions to be the leads 322, are shifted from the centers of the portions to be the leads 312, respectively, in a planar view. Then, laser beam is irradiated from a direction of arrows B at the concave portions 33y, which function as a mark, to locally melt metal materials of the portions to be the leads 322 and the portions to be the leads 332, and bond the metal plate 320 and the metal plate 330 (laser welding).

Figure 8C:
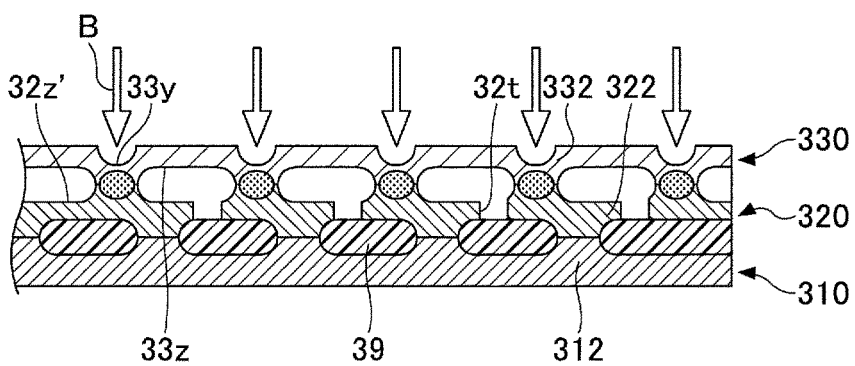
Figure 8D:
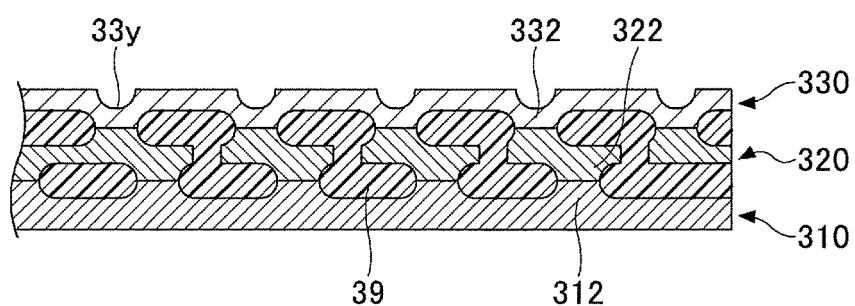

Next, in a step illustrated in FIG. 8D, similar to the step illustrated in FIG. 5B and FIG. 5C, resin is filled in space portions (including the open portions 32t) formed by the metal plate 320 and the metal plate 330, and is cured. With this, the resin portion 39 that continuously fill the space portions formed by the metal plate 310 and the metal plate 320, the open portions 32t and the space portions formed by the metal plate 320 and the metal plate 330 is formed.

Thereafter, similar to the step illustrated in FIG. 5D, predetermined portions of the metal plates 310 and 330 are removed by etching in the structure illustrated in FIG. 8D. With this, the unit lead frame 30A as illustrated in FIG. 7 having a so-called staggered via structure and including the external connection terminals 315A in which the leads 312, the leads 322 and the leads 332 are stacked, respectively, is formed. The wirings 323 and the like may be formed when removing the predetermined portions of the metal plates 310 and 330 by etching.

As such, by stacking three of more frames, as three-dimensional arrangement is possible, design freedom of the lead frame can be improved.

Alternative Example 2 of First Embodiment

In alternative example 2 of the first embodiment, another example of a lead frame in which a structure of the leads is different from that of the first embodiment is described. It is to be noted that, in the alternative example 2 of the first embodiment, the same components already described in the above embodiment are given the same reference numerals, and explanations are not repeated.

Figure 9:
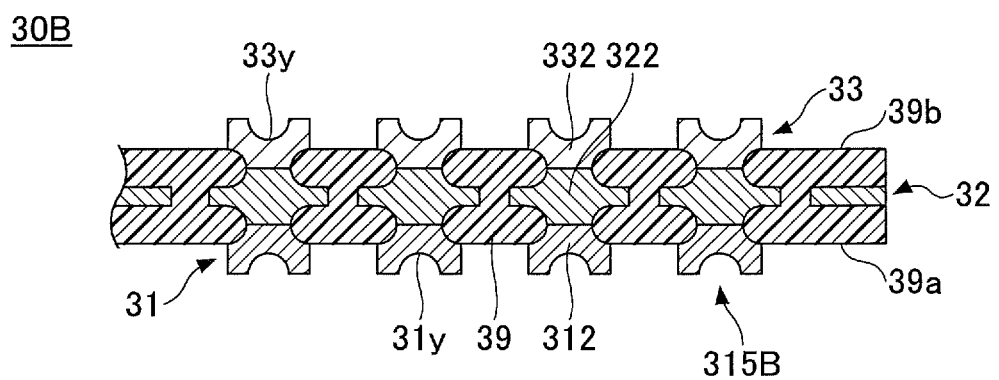
FIG. 9 is a cross-sectional view illustrating an alternative example 2 of the lead frame of the first embodiment.

FIG. 9 is a cross-sectional view illustrating an example of a lead frame of alternative example 2 of the first embodiment, in which only the vicinity of leads of a unit lead frame 30B is illustrated in an enlarged manner.

The unit lead frame 30B illustrated in FIG. 9 is different from the unit lead frame 30A (see FIG. 7) in that the leads 312, the leads 322 and the leads 332 are stacked at the same positions, respectively, in a planar view to form external connection terminals 315B that are so-called stacked via structure. Further, the unit lead frame 30B is different from the unit lead frame 30A (see FIG. 7) in that concave portions 31y are formed at the lower surface of the leads 312, respectively, instead of the concave portions 32y formed at the upper surface of the leads 322, respectively.

Here, although not illustrated in the drawings, the bonding pads 321 and the wirings 323 are formed in the frame 33 in the unit lead frame 30B. Further, wirings similar to the wirings 323 may be formed in the frame 32.

Further, not only the frame 32, two or more frames may be provided between the frame 31 and the frame 33 (as the frames embedded in the resin portion 39). In such a case, the external connection terminal 315B in which four or more leads are stacked having a so-called stacked via can be actualized.

FIG. 10A to FIG. 10D are views illustrating an example of manufacturing steps of the lead frame of the alternative example 2 of the first embodiment. FIG. 10A to FIG. 10D are views for mainly explaining steps for manufacturing leads and illustrate cross-sections corresponding to FIG. 9.

First, steps similar to those described above with reference to FIG. 3A to 4C are performed. However, the concave portion 32y is not formed at the upper surface of each of the portions to be the leads 322 of the metal plate 320. Instead, the concave portion 31y is formed at the lower surface of each of the portions to be the leads 312 of the metal plate 310. Thereafter, in a step illustrated in FIG. 10A, similar to the step illustrated in FIG. 5A, the metal plate 320 is placed on the metal plate 310 such that the portions to be the leads 312 and the portions to be the leads 322 overlap with each other, respectively, in a planar view. Then, the metal materials of the portions to be the leads 312 and the portions to be the leads 322 are locally melted by irradiating laser beam from a direction of arrows B at the concave portions 31y, which function as a mark, to bond the metal plate 310 and the metal plate 320 (laser welding).

Figure 10A:
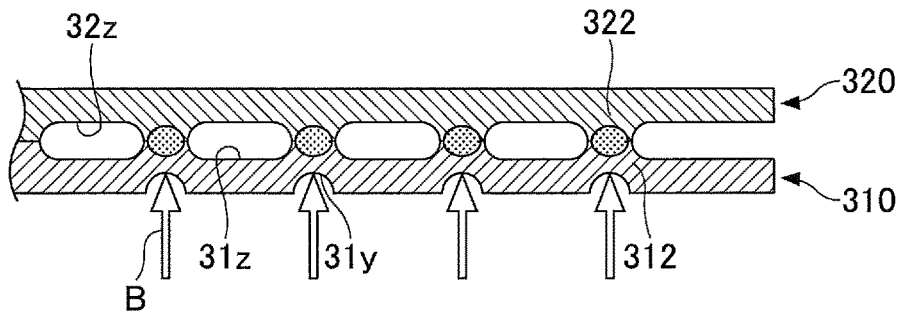
FIG. 10A to FIG. 10D are views illustrating an example of manufacturing steps of the alternative example 2 of the lead frame of the first embodiment.
Figure 10B:
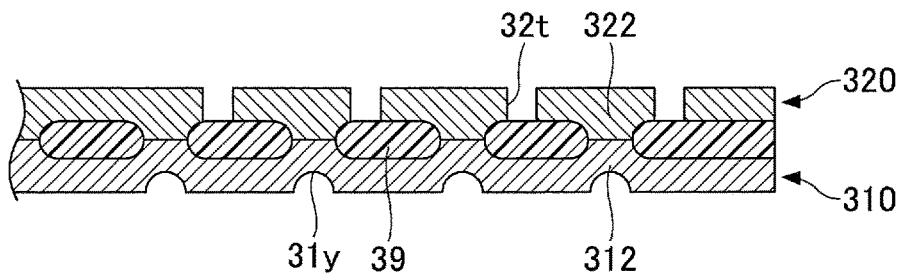

Next, in a step illustrated in FIG. 10B, similar to the step illustrated in FIG. 8B, resin is filled in space portions formed by the metal plate 310 and the metal plate 320, and the resin portion 39 is formed by curing it. Thereafter, open portions 32t that selectively expose the upper surface of the resin portion 39 are formed in the metal plate 320 by etching, laser processing or the like.

Figure 10C:
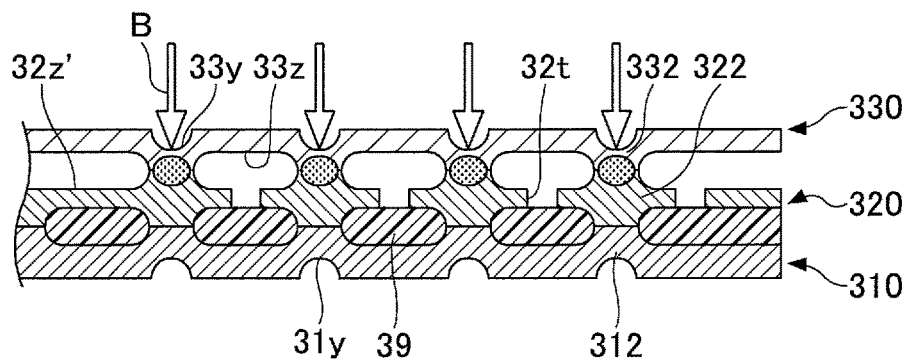

Next, in a step illustrated in FIG. 10C, similar to the step illustrated in FIG. 8C, the metal plate 330 provided with the portions to be the leads 332, the concave portions 33y and the concave portions 33z is formed. Further, the concave portions 32z' are formed at the upper surface of the metal plate 320 by etching. Then, the metal plate 330 is stacked on the metal plate 320 such that the centers of the portions to be the leads 332, on the portions to be the leads 322, match the centers of the portions to be the leads 312, respectively, in a planar view. Then, laser beam is irradiated from a direction of arrows B at the concave portions 33y, which function as a mark, to locally melt metal materials of the portions to be the leads 322 and the portions to be the leads 332, and bond the metal plate 320 and the metal plate 330 (laser welding).

Figure 10D:
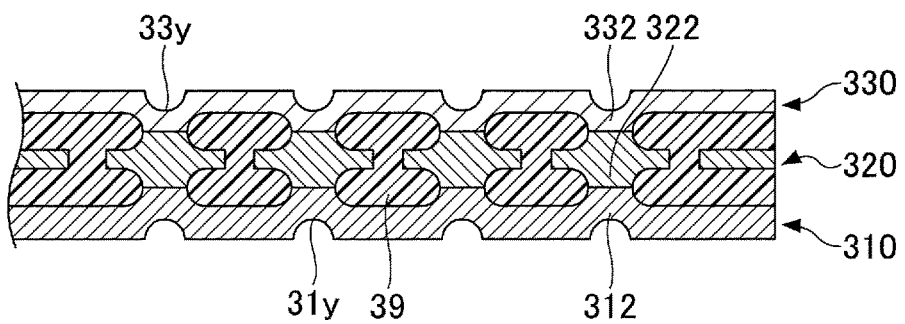

Next, in a step illustrated in FIG. 10D, similar to the step illustrated in FIG. 8D, resin is filled in space portions (including the open portions 32t) formed by the metal plate 320 and the metal plate 330, and is cured. With this, the resin portion 39 that continuously fill the space portions formed by the metal plate 310 and the metal plate 320, the open portions 32t and the space portions formed by the metal plate 320 and the metal plate 330 is formed.

Thereafter, similar to the step illustrated in FIG. 5D, predetermined portions of the metal plates 310 and 330 are removed by etching in the structure illustrated in FIG. 10D. With this, the unit lead frame 30B as illustrated in FIG. 9 having a so-called stacked via structure and including the external connection terminals 315B in which the leads 312, the leads 322 and the leads 332 are stacked, respectively, is formed. The wirings 323 and the like may be formed when removing the predetermined portions of the metal plates 310 and 330 by etching.

As such, by stacking three of more frames, as three-dimensional arrangement is possible, design freedom of the lead frame can be improved.

Alternative Example 3 of First Embodiment

In alternative example 3 of the first embodiment, an example of a lead frame in which an electronic component is included in the resin portion is described. It is to be noted that, in the alternative example 3 of the first embodiment, the same components already described in the above embodiment are given the same reference numerals, and explanations are not repeated.

Figure 11:
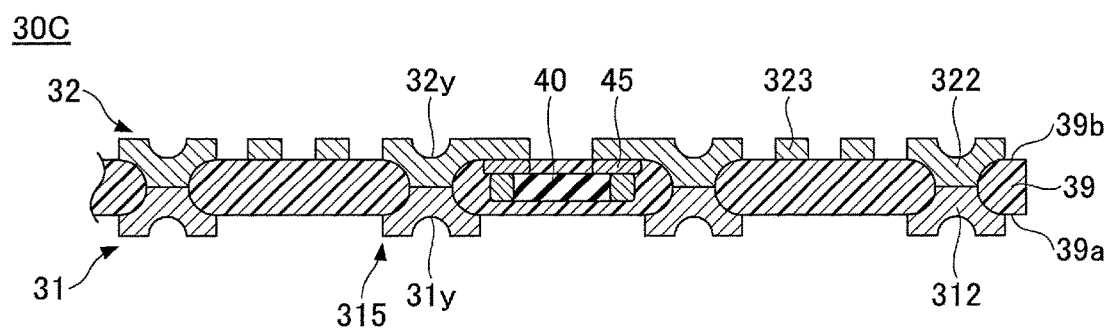
FIG. 11 is a cross-sectional view illustrating an alternative example 3 of the lead frame of the first embodiment.

FIG. 11 is a cross-sectional view illustrating an example of a lead frame of the alternative example 3 of the first embodiment, in which only the vicinity of leads of a unit lead frame 30C is illustrated in an enlarged manner.

The unit lead frame 30C illustrated in FIG. 11 is different from the unit lead frame 30 (see FIG. 2A to FIG. 2D) in that an electronic component 40 is mounted in a space formed between the frame 31 and the frame 32, and the electronic component 40 is sealed by the resin portion 39. Further, the unit lead frame 30C is different from the unit lead frame 30 (see FIG. 2A to FIG. 2D) in that the concave portion 31y is formed at the lower surface of each of the leads 312.

The electronic component 40 is an electronic component provided with 2 terminals, for example, and one of the terminals is connected to one of the leads 322 via a bonding portion 45, and the other of the terminals is connected to another one of the leads 322 via another bonding portion 45. For the electronic component 40, a laminated ceramic capacitor or the like may be used, for example. For the bonding portion 45, solder or a conductive paste (silver paste or the like) may be used, for example.

Figure 12A:
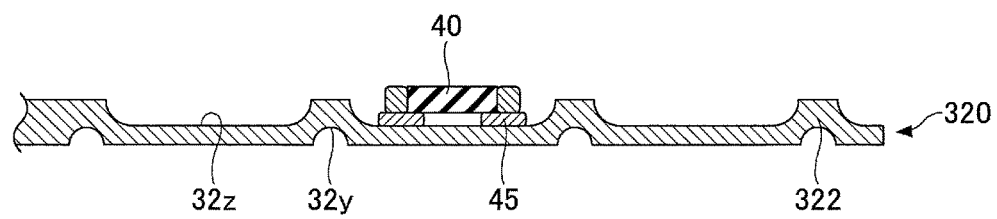
FIG. 12A to FIG. 12C are views illustrating an example of manufacturing steps of the alternative example 3 of the lead frame of the first embodiment.
Figure 12B:
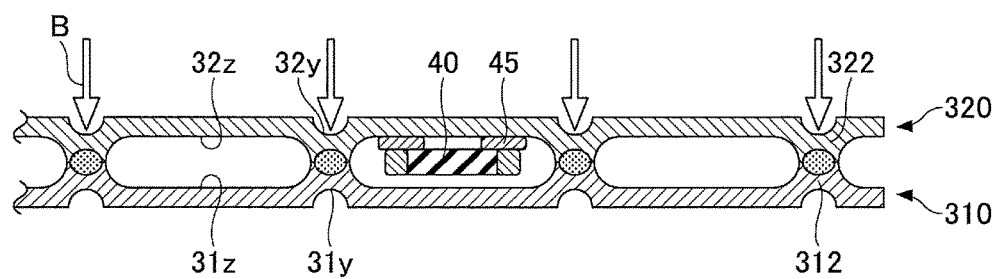
Figure 12C:
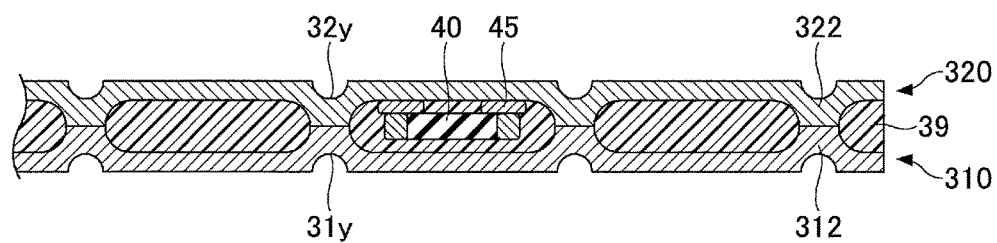

FIG. 12A to FIG. 12C are views illustrating an example of manufacturing steps of the lead frame of the alternative example 3 of the first embodiment. FIG. 12A to FIG. 12C are views for mainly explaining steps for mounting the electronic component and illustrates cross-sections corresponding to FIG. 11.

First, after performing the steps similar to those explained above with reference to FIG. 4A to FIG. 4C, in a step illustrated in FIG. 12A, the electronic component 40 is mounted in the concave portion 32z of the metal plate 320 via the bonding portions 45.

Next, after performing steps similar to those described above with reference to FIG. 3A to FIG. 3C, in a step illustrated in FIG. 12B, similar to the step illustrated in FIG. 5A, the metal plate 320, after reversing from that illustrated in FIG. 12A, is placed on the metal plate 310 such that the portions to be the leads 312 and the portions to be the leads 322 overlap, respectively, in a planar view. Then, the metal materials of the portions to be the leads 312 and the portions to be the leads 322 are locally melted by irradiating laser beam from a direction of arrows B at the concave portions 32y, which function as a mark, to bond the metal plate 310 and the metal plate 320 (laser welding). With this, the electronic component 40 is mounted in the concave portion 31z of the metal plate 310 and the concave portion 32z of the metal plate 320.

Next, in a step illustrated in FIG. 12C, similar to the step illustrated in FIG. 5B and FIG. 5C, resin is filled in space portions formed by the metal plate 310 and the metal plate 320, and the resin portion 39 is formed by curing it. With this, the electronic component 40 is sealed by the resin portion 39.

Thereafter, similar to the step illustrated in FIG. 5D, predetermined portions of the metal plates 310 and 320 are removed by etching in the structure illustrated in FIG. 12C. With this, the unit lead frame 30C illustrated in FIG. 11 is formed.

As such, by using the unit lead frame 30C in which the electronic component is mounted between the frames that are stacked with each other, a QFN type semiconductor device in which an electronic component is mounted, which is conventionally difficult to be actualized, can be obtained. Further, as the electronic component can be provided in the vicinity of a power source of a semiconductor chip, when the electronic component is a laminated ceramic capacitor, an effect of removing noise can be improved.

Alternative Example 4 of First Embodiment

In alternative example 4 of the first embodiment, an example of a lead frame in which wirings are formed in the resin portion as well is described. It is to be noted that, in the alternative example 4 of the first embodiment, the same components already described in the above embodiment are given the same reference numerals, and explanations are not repeated.

Figure 13:
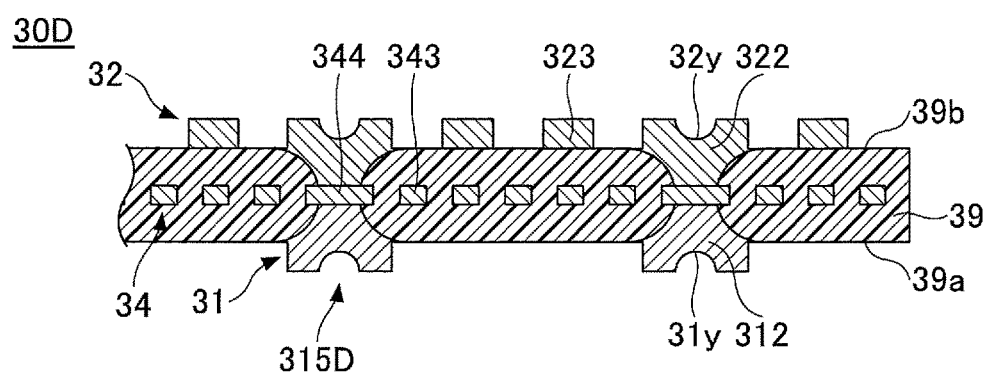
FIG. 13 is a cross-sectional view illustrating an alternative example 4 of the lead frame of the first embodiment.

FIG. 13 is a cross-sectional view illustrating an example of a lead frame 30D of the alternative example 4 of the first embodiment, in which only the vicinity of leads of the unit lead frame 30D is illustrated in an enlarged manner.

The unit lead frame 30D illustrated in FIG. 13 includes the frame 31, the frame 32, a frame 34 and the resin portion 39. The frame 34 includes wirings 343 and pads 344. In this embodiment, the frame 31 is a typical example of a first lead frame of the invention. The frame 32 is a typical example of a second lead frame of the invention.

The unit lead frame 30D has a structure in which the upper surface of the lead 312 of the frame 31 and a lower surface of the pad 344 of the frame 34 are welded, and the lower surface of the lead 322 of the frame 32 and an upper surface of the pad 344 of the frame 34 are welded. The lead 312, the lead 322 and the pad 344 may be provided to overlap with each other in a planar view, for example.

The resin portion 39 is filled in spaces formed by the upper surface of the frame 31 and the lower surface of the frame 32, and the wirings 343 and the pads 344 that constitute the frame 34 are embedded in the resin portion 39. The thickness of the wiring 343 and the pad 344 may be about 15 μm, for example. The wirings 343 may be formed to be high density compared with the wirings 323. The line/space of the wirings 343 may be about 30 μm/30 μm, for example. The size of the pad 344 may be arbitrarily determined to be appropriate for welding of the leads 312 and 322. The wiring 343 is a typical example of a third lead of the invention. As such, the third lead is not necessarily formed in a lead frame.

Further, not only the frame 34, two or more frames may be provided between the frame 31 and the frame 32 (as the frames embedded in the resin portion 39). In such a case, two or more layers of wiring may be embedded in the resin portion 39.

FIG. 14A to FIG. 15C are views illustrating an example of manufacturing steps of the lead frame of the alternative example 4 of the first embodiment. FIG. 14A to FIG. 15C are views for mainly explaining steps for manufacturing leads and illustrate cross-sections corresponding to FIG. 13.

Figure 14A:
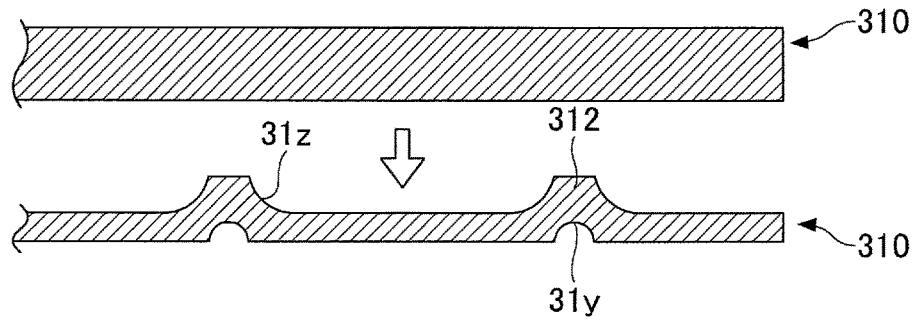
FIG. 14A to FIG. 14D are views (No. 1) illustrating an example of manufacturing steps of the alternative example 4 of the lead frame of the first embodiment.
Figure 14B:
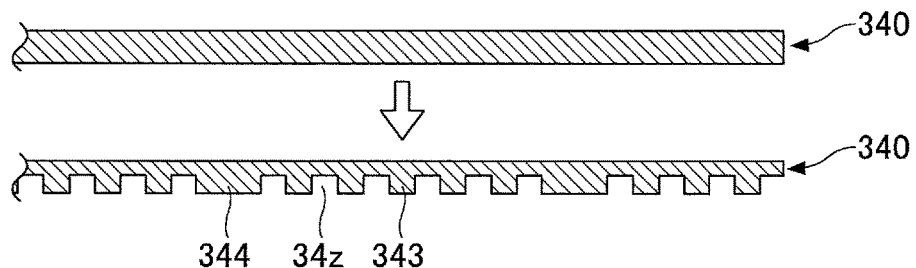

First, in a step illustrated in FIG. 14A, a metal plate 310 is prepared. Then, similar to the step illustrated in FIG. 3A to FIG. 3C, the concave portions 31z are formed at the upper surface of the metal plate 310 by half etching. Parts of the areas at which the concave portions 31z are not formed become the chip mounting portion 311 (not illustrated in FIG. 14A to FIG. 15C) and the plurality of leads 312. Further, the concave portions 31y are formed at the lower surface of the metal plate 310 by half etching. The thickness of the metal plate 310 may be about 0.1 mm, for example.

Next, in a step illustrated in FIG. 143, a metal plate 340, which is thinner than the metal plate 310, is prepared. Then, slits 34z are formed by half etching one surface to form portions to be wirings 343 and portions to be pads 344. The thickness of the metal plate 340 may be about 30 μm, for example. The width of the slit 34z may be about 30 μm, for example. The space between the slits 34z may be about 30 μm, for example. The depth of the slit 34z may be about 15 μm, for example.

Figure 14C:
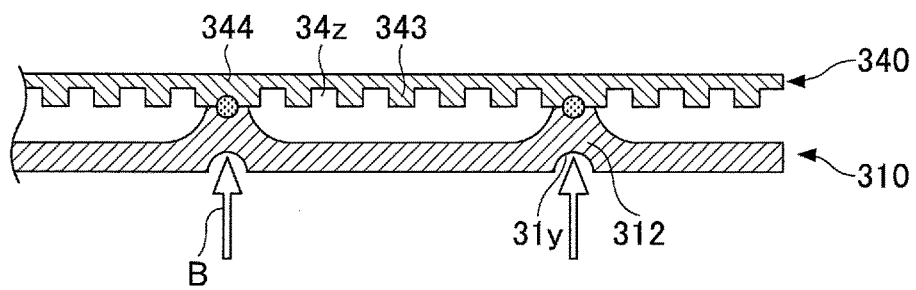

Next, in a step illustrated in FIG. 14C, the metal plate 340 is placed on the metal plate 310 such that the portion to be the lead 312 and the portion to be the pad 344 overlap in a planar view. Then, laser beam is irradiated from a direction of arrows B at the concave portions 31y, which function as a mark, to locally melt the metal materials of the portions to be the leads 312 and the portions to be the pads 344, and bond the metal plate 310 and the metal plate 340 (laser welding).

Figure 14D:
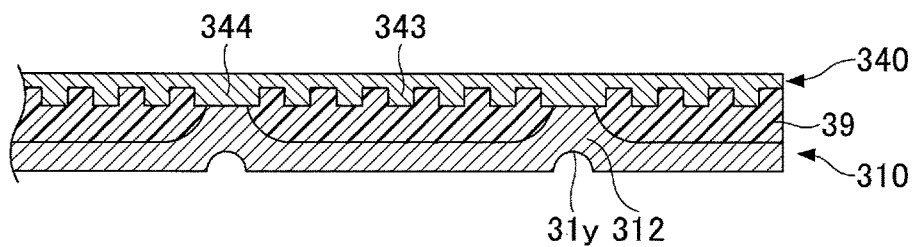

Next, in a step illustrated in FIG. 14D, similar to the step illustrated in FIG. 5B and FIG. 5C, resin is filled in space portions formed by the metal plate 310 and the metal plate 340, and the resin portion 39 is formed by curing it. Next, in a step illustrated in FIG. 15A, an upper surface of the metal plate 340 is half etched to remove portions that connect portions to be the wirings 343 and portions to be the pads 344. With this, the wirings 343 and the pads 344 are independently formed, and the frame 34 is completed.

Figure 15A:
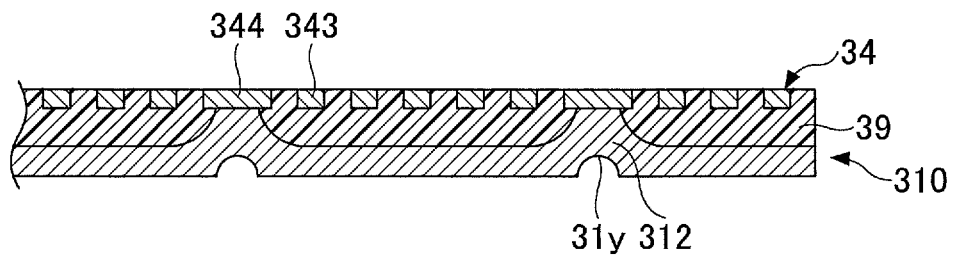
FIG. 15A to FIG. 15C are views (No. 2) illustrating an example of the manufacturing steps of the alternative example 4 of the lead frame of the first embodiment.
Figure 15B:
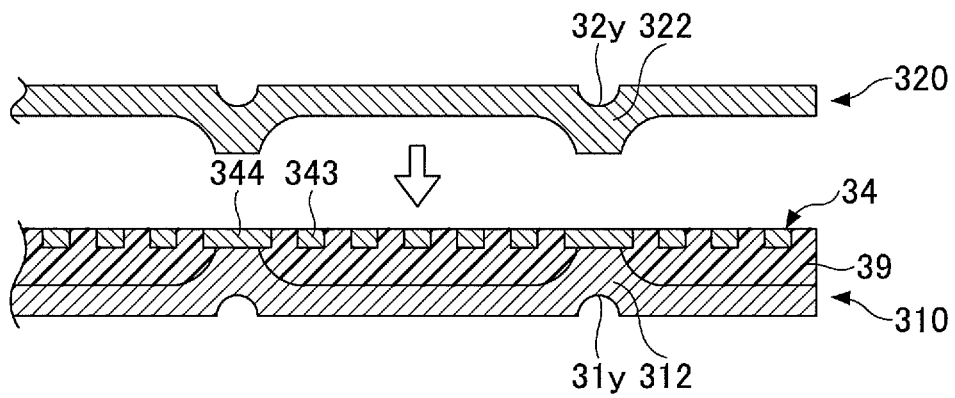
Figure 15C:
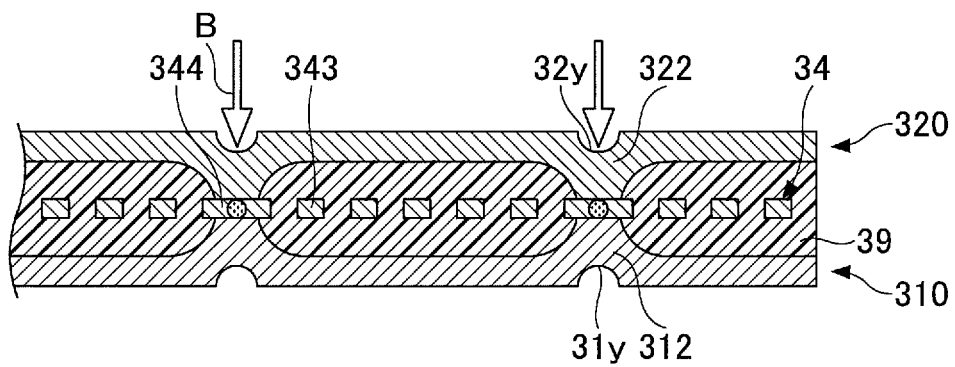

Next, in a step illustrated in FIG. 15B, similar to the step illustrated in FIG. 4A to FIG. 4C, the metal plate 320 provided with the portions to be the leads 322 and the concave portions 32y is formed. Then, the metal plate 320 is stacked on the wirings 343 and the pads 344 such that the portions to be the leads 322 are placed on the pads 344, respectively. Then, in a step illustrated in FIG. 15C, laser beam is irradiated from a direction of arrows B at the concave portions 32y, which function as a mark, to locally melt metal materials of the portions to be the leads 322 and the portions to be the pads 344, and bond the metal plate 320 and the pads 344 (laser welding).

Next, similar to the step illustrated in FIG. 14D, resin is filled in space portions formed by the metal plate 320 and the frame 34, and the resin portion 39 is formed by curing it. Thereafter, similar to the step illustrated in FIG. 5D, predetermined portions of the metal plates 310 and 320 are removed by etching in the structure illustrated in FIG. 15C. With this, the unit lead frame 30D illustrated in FIG. 13 is formed.

Here, the structure illustrated in FIG. 15A may be used as a final product. This means that a lead frame constituted by the frame 31, the frame 34 and the resin portion 39 may also be used.

As such, by embedding high density wirings in the resin portion 39, design freedom of the lead frame can be improved.

Alternative Example 5 of First Embodiment

In alternative example 5 of the first embodiment, an example of a lead frame for flip-chip mounting is described. It is to be noted that, in the alternative example 5 of the first embodiment, the same components already described in the above embodiment are given the same reference numerals, and explanations are not repeated.

Figure 16:
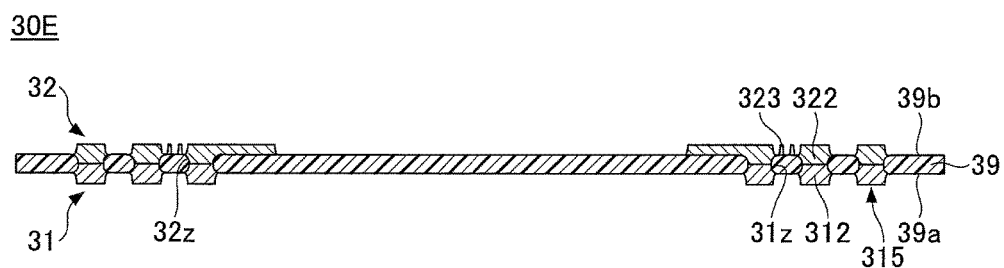
FIG. 16 is a cross-sectional view illustrating an example of a unit lead frame that constitutes alternative example 5 of the lead frame of the first embodiment.

FIG. 16 is a cross-sectional view illustrating an example of a unit lead frame 30E that constitutes a lead frame of the alternative example 5 of the first embodiment.

With reference to FIG. 16, the unit lead frame 30E is different from the unit lead frame 30 (see FIG. 2A to FIG. 2D) in that the chip mounting portion 311 is not provided at the frame 31, and the bonding pads 321 are not provided at the frame 32. The unit lead frame 30E is a lead frame for a flip-chip mounted semiconductor device. As bumps are formed at the upper surfaces of the leads 322, respectively, the concave portions 32y are not formed at the upper surfaces of the leads 322 and the upper surfaces of the leads 322 are flat. This means that, in this embodiment, the upper surfaces of the leads 322 are not portions to be welded, and portions to be welded are provided in the vicinity of the leads 32, respectively.

(Example of Semiconductor Device)

Figure 17:
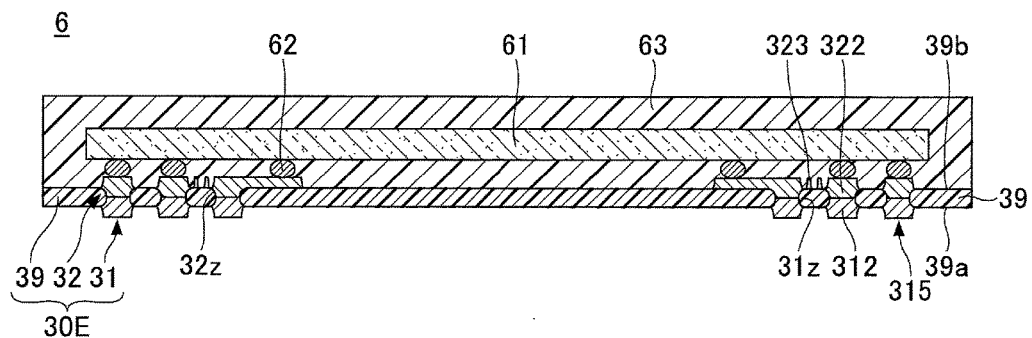
FIG. 17 is a cross-sectional view illustrating an example of a semiconductor device using the alternative example 5 of the lead frame of the first embodiment.

FIG. 17 is a cross-sectional view illustrating an example of a semiconductor device 6 including the lead frame of the alternative example 5 of the first embodiment.

With reference to FIG. 17, the semiconductor device 6 includes the unit lead frame 30E, a semiconductor chip 61, bumps 62 and a sealing resin 63. The semiconductor device 6 is a QFN type semiconductor device.

The semiconductor chip 61 is flip-chip mounted on an upper surface side of the unit lead frame 30E. Specifically, electrodes (not illustrated in the drawings) of the semiconductor chip 61 are connected to the upper surfaces of the leads 322 of the unit lead frame 30E by the bumps 62, respectively. For the bump 62, a solder bump may be used, for example. In such a case, for the material of solder, alloy containing Pb, alloy of Sn and Cu, alloy of Sn and Ag, alloy of Sn, Ag and Cu or the like may be used, for example.

The sealing resin 63 is provided to cover the upper surface of the unit lead frame 30E and the semiconductor chip 61. For the material of the sealing resin 63, epoxy based resin or the like that has good rigidity may be used, for example. The sealing resin 63 may contain fillers such as silica ($SiO_2$) or the like. Here, underfill resin may be provided to fill a space between the upper surface of the unit lead frame 30E and the semiconductor chip 61, and thereafter, the sealing resin 63 may be provided.

In order to manufacture the semiconductor device 6, first, the semiconductor chips 61 are flip-chip mounted on the plurality of unit lead frames 30E that are arranged similar to the lead frame 1 illustrated in FIG. 1, in a face-down manner. Specifically, cream solder or the like is coated at predetermined areas of the upper surfaces of the leads 322 of each of the unit lead frames 30E. Then, the semiconductor chips 61 are placed on the unit lead frames 30E such that the electrodes of each of the semiconductors chip 61 are positioned above the cream solder or the like. Then, the cream solder or the like are melted and solidified to form the bumps 62 by reflow or the like. With this, the semiconductor chips 61 are flip-chip mounted on the unit lead frames 30E, respectively.

Next, after filling underfill resin in the space between the upper surface of the unit lead frame 30E and the semiconductor chip 61, if necessary, the sealing resin 63 is formed to cover the upper surface of the unit lead frame 30E and the semiconductor chip 61. The sealing resin 63 may be formed by transfer molding, compression molding, injection molding or the like, for example. The sealing resin 63 may be formed for each of the unit lead frame groups 20 illustrated in FIG. 1, for example.

Thereafter, the unit lead frame group 20 for which the sealing resin 63 and the like are formed is individualized into the unit lead frames 30E by cutting by a dicer or the like to complete a plurality of the semiconductor devices 6 (see FIG. 16).

As such, by using the lead frame 1 including the unit lead frames 30E, the semiconductor device 6 in which the number of external connection terminals 315 is increased compared with a conventional product can be actualized.

Further, the lower end portion of the lead 312 that constitutes the external connection terminal 315 is protruded from the lower surface 39a of the resin portion 39. Thus, when mounting the semiconductor device 6 on a wiring board or the like, solder wetly spreads at a side surface of the protruding portion 312p (see FIG. 18) of the lead 312. Therefore, reliability in connection between the semiconductor device 6 and the wiring board or the like can be improved.

According to the disclosed technique, a lead frame that is hardly deformed even when being made thinner is provided.

Although a preferred embodiment of the lead frame and the semiconductor device has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, although examples in which the frames are bonded by welding are described in the above described embodiments and the alternative examples, instead of welding, the frames may be bonded by a conductive adhesive agent. Alternatively, the frames may be bonded by a mechanical bonding method.

Further, the above described embodiments and the alternative examples may be arbitrarily combined.

Various aspects of the subject-matter described herein are set out non-exhaustively in the following numbered clauses:

1. A method of method of manufacturing a lead frame, including:
    etching one surface of a first metal plate to form a first frame provided with a concave portion at the one surface;
    etching one surface of a second metal plate to form a second frame provided with a concave portion at the one surface;
    bonding the first frame and the second frame such that the concave portion of the first frame and the concave portion of the second frame face with each other to form a space;
    filling resin in the space and curing the resin to form a resin portion; and
    removing a predetermined portion of each of the first frame and the second frame by etching to form a lead that is provided at a surface of the resin portion at one of the first frame and the second frame.

What is claimed is:

1. A lead frame comprising:
    a resin portion including a first surface and a second surface which is opposed from the first surface;
    a plurality of first leads formed from a first lead frame; and
    a plurality of second leads formed from a second lead frame,
    wherein the first leads and the second leads penetrate the first surface and the second surface of the resin portion, respectively, and
    wherein the first leads and the second leads are bonded in the resin portion, respectively.

2. The lead frame according to claim 1, wherein a surface roughing process or an oxidation process is performed at portions of the first leads and the second leads that contact a surface of the resin portion, respectively.

3. The lead frame according to claim 1, wherein a concave portion is provided at a protruding portion of one of the first lead and the respective second lead.

4. The lead frame according to claim 1, further comprising: a die pad on which a semiconductor chip is mounted, the die pad being formed from one of the first lead frame and the second lead frame.

5. The lead frame according to claim 1, wherein a constriction is provided at each of a side surface of each of the first leads embedded in the resin portion and a side surface of each of the second leads embedded in the resin portion.

6. The lead frame according to claim 1, further comprising a plurality of third leads, each of which is provided between the respective first lead and the respective second lead,
    wherein the third leads are embedded in the resin portion, and
    wherein each of the first leads and each of the second leads are bonded in the resin portion via the respective third lead.

7. The lead frame according to claim 6, wherein the third leads are formed to be a high density lead whose line/space is narrower than that of the second leads.

8. The lead frame according to claim 1, wherein an electronic component is embedded in the resin portion, and the electronic component is electrically connected to one of the first leads and the second leads.

9. A semiconductor device comprising:
    the lead frame of claim 1;
    a semiconductor chip mounted on the lead frame; and
    a sealing resin that seals the semiconductor chip.

10. The lead frame according to claim 1,
    the first leads and the second leads are protruding from the first surface and the second surface of the resin portion, respectively.

11. The lead frame according to claim 1,
    wherein a plurality of openings are formed in the resin portion, each of the openings extending from the first surface of the resin portion to the second surface of the resin portion,
    wherein each of the first leads includes an embedded portion embedded in the respective opening of the resin portion and a protruding portion protruding from the first surface of the resin portion,
    wherein each of the second leads includes an embedded portion embedded in the respective opening of the resin portion and a protruding portion protruding from the second surface of the resin portion, and
    wherein the embedded portion of each of the first leads and the embedded portion of each of the second leads are bonded in the respective opening of the resin portion.

12. The lead frame according to claim 11, wherein each of the first leads and each of the second leads form a lead that penetrates through the resin portion from the first surface to the second surface in the respective opening and also extends above the first surface and the second surface, respectively.

13. The lead frame according to claim 1, further comprising:
    a wiring, formed from one of the first lead frame and the second lead frame, which is not embedded in the resin portion such that the wiring is formed on one of the first surface and the second surface of the resin portion to contact the respective first surface or the second surface of the resin portion, respectively.

* * * * *